United States Patent
Hsieh et al.

(10) Patent No.: US 10,177,311 B1
(45) Date of Patent: Jan. 8, 2019

(54) RESISTIVE RANDOM ACCESS MEMORY (RRAM) AND FABRICATION METHOD THEREOF

(71) Applicant: UNITED MICROELECTRONICS CORP., Hsin-Chu (TW)

(72) Inventors: Chao-Ching Hsieh, Tainan (TW); Chih-Chien Liu, Taipei (TW); Yu-Ru Yang, Hsinchu County (TW); Hsiao-Pang Chou, Taipei (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 15/782,836

(22) Filed: Oct. 12, 2017

(51) Int. Cl.
  *G11C 13/00* (2006.01)
  *H01L 45/00* (2006.01)
  *H01L 27/24* (2006.01)

(52) U.S. Cl.
  CPC .......... *H01L 45/16* (2013.01); *H01L 27/2436* (2013.01); *H01L 27/2463* (2013.01); *G11C 13/0002* (2013.01)

(58) Field of Classification Search
  CPC . G11C 13/0004; G11C 11/56; G11C 11/5678; G11C 8/16
  USPC ............ 257/329, E45.002, E21.09, E21.614, 257/E27.108, 2, 204, 401, 42, E23.101, 257/E29.262, E45.003, 369, 499; 365/51, 365/63, 148, 163, 230.06, 94
  See application file for complete search history.

(56) References Cited

U.S. PATENT DOCUMENTS

| | | |
|---|---|---|
| 8,350,247 B2 | 1/2013 | Lee |
| 8,902,634 B2 | 12/2014 | Iwayama |
| 9,306,162 B2 | 4/2016 | Sills |
| 2006/0226411 A1* | 10/2006 | Lee .......................... G11C 11/56 257/2 |

* cited by examiner

*Primary Examiner* — Thong Q Le
(74) *Attorney, Agent, or Firm* — Winston Hsu

(57) ABSTRACT

A resistive random access memory (RRAM) cell includes a substrate, a transistor having a gate on the substrate and a source/drain region in the substrate, a first inter-layer dielectric layer covering the transistor, a contact plug disposed in the first inter-layer dielectric layer and landing on the source/drain region, a resistive material layer conformally covering a protruding upper end portion of the contact plug, and a top electrode on the resistive material layer.

20 Claims, 4 Drawing Sheets

RESISTIVE RANDOM ACCESS MEMORY (RRAM) AND FABRICATION METHOD THEREOF

BACKGROUND OF THE INVENTION

1. Field of the Invention

The present invention relates generally to the field of resistive random access memory (RRAM). More particularly, the present invention relates to a 1T1R RRAM cell and a fabrication method thereof.

2. Description of the Prior Art

Resistive random access memory (RRAM) is known in the art. RRAM is a memory structure including an array of RRAM cells each of which stores a bit of data using resistance values, rather than electronic charge. Particularly, each RRAM cell includes a resistive material layer, the resistance of which can be adjusted to represent logic "0" or logic "1."

There are various architectures to configure an array of RRAM cells. For example, a cross-point architecture include a RRAM in each cell configured between crossed a word line and a bit line. In another example, transistor-type architecture pairs a RRAM with a transistor (1T1R) in each cell and improves random access time at the expense of cell area.

SUMMARY OF THE INVENTION

It is one object of the invention to provide an improved resistive random access memory (RRAM) cell, which has a smaller cell size and can be integrated into contact processes.

According to one embodiment, a resistive random access memory (RRAM) cell includes a substrate, a transistor having a gate on the substrate and a source/drain region in the substrate, a first inter-layer dielectric layer covering the transistor, a contact plug disposed in the first inter-layer dielectric layer and landing on the source/drain region, a resistive material layer conformally covering a protruding upper end portion of the contact plug, and a top electrode on the resistive material layer.

According to another embodiment, a method for fabricating a resistive random access memory (RRAM) cell is provided. A transistor having a gate is formed on a substrate. The transistor includes a source/drain region in the substrate. A first inter-layer dielectric layer is deposited to cover the transistor. A contact plug is formed in the first inter-layer dielectric layer and landed on the source/drain region. An upper end portion of the contact plug protrudes from a top surface of the first inter-layer dielectric layer. A resistive material layer is formed on the protruding upper end portion of the contact plug. A top electrode is formed on the resistive material layer.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
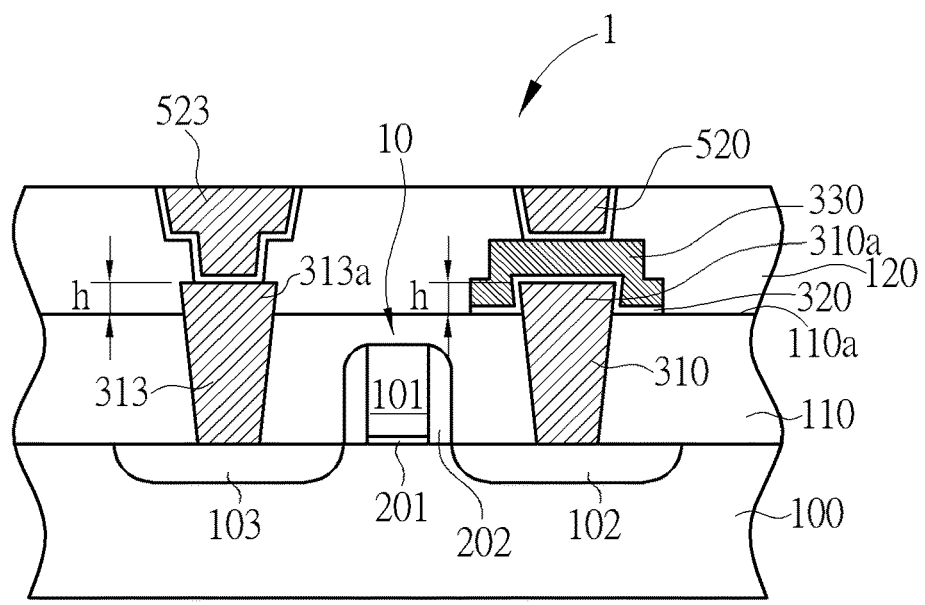
FIG. 1 is a schematic, cross-sectional view showing a resistive random access memory (RRAM) cell in accordance with one embodiment of the invention.

In the following detailed description of the disclosure, reference is made to the accompanying drawings, which form a part hereof, and in which is shown, by way of illustration, specific embodiments in which the invention may be practiced. These embodiments are described in sufficient detail to enable those skilled in the art to practice the invention. Other embodiments may be utilized and structural changes may be made without departing from the scope of the present disclosure.

The following detailed description is, therefore, not to be taken in a limiting sense, and the scope of the present invention is defined only by the appended claims, along with the full scope of equivalents to which such claims are entitled. One or more implementations of the present invention will now be described with reference to the attached drawings, wherein like reference numerals are used to refer to like elements throughout, and wherein the illustrated structures are not necessarily drawn to scale.

As described in the embodiments herein, steps such as deposition, patterning or etching of various films (including conductive films, metals, dielectric layers, etc.) can be accomplished using known processes such as chemical vapor deposition, physical vapor deposition, sputtering, atomic layer deposition, optical lithography processes, plasma dry etching, wet etching, reactive ion etching, and the like, the details of which will not be repeated.

FIG. 1 is a schematic, cross-sectional view showing a resistive random access memory (RRAM) cell in accordance with one embodiment of the invention. As shown in FIG. 1, the RRAM cell 1 comprises a substrate 100 such as a semiconductor substrate. According to one embodiment, the substrate 100 may be a silicon substrate, but is not limited thereto.

A transistor 10 is disposed on the substrate 100. The transistor 10 includes a gate 101 on the substrate 100 and a source/drain region 102 in the substrate 100. A gate dielectric layer 201 such as a silicon oxide layer may be disposed between the gate 101 and the substrate 100. A spacer 202 may be disposed on each sidewall of the gate 101.

According to one embodiment, a first inter-layer dielectric (ILD) layer 110 such as a silicon oxide layer is deposited on the substrate 100 to cover the transistor 10. The ILD layer 110 covers the gate 101 and the source/drain region 102.

According to one embodiment, a contact plug 310 such as a tungsten contact plug is disposed in the first ILD layer 110 and lands on the source/drain region 102. An upper end portion 310a of the contact plug 310 protrudes from a top surface 110a of the first ILD layer 110.

According to one embodiment, a height h of the protruding upper end portion 310a of the contact plug 310 above the top surface 110a of the first ILD layer 110 may range between 0 and 200 angstroms, preferably, about 100 angstroms.

According to one embodiment, the contact plug 310 may comprise more than one conductive layer and is fabricated in a $M_0$ layer. For example, the contact plug 310 may comprise a barrier layer and a tungsten layer.

According to one embodiment, a resistive material layer 320 conformally covers the protruding upper end portion 310a of the contact plug 310. According to one embodiment, the resistive material layer may comprise hafnium oxide, zirconium oxide, aluminum oxide, nickel oxide, tantalum oxide or titanium oxide, but is not limited thereto.

According to one embodiment, the resistive material layer 320 is in direct contact with the protruding upper end portion 310a of the contact plug 310, and the contact plug 310 acts as a bottom electrode.

Figure 2:
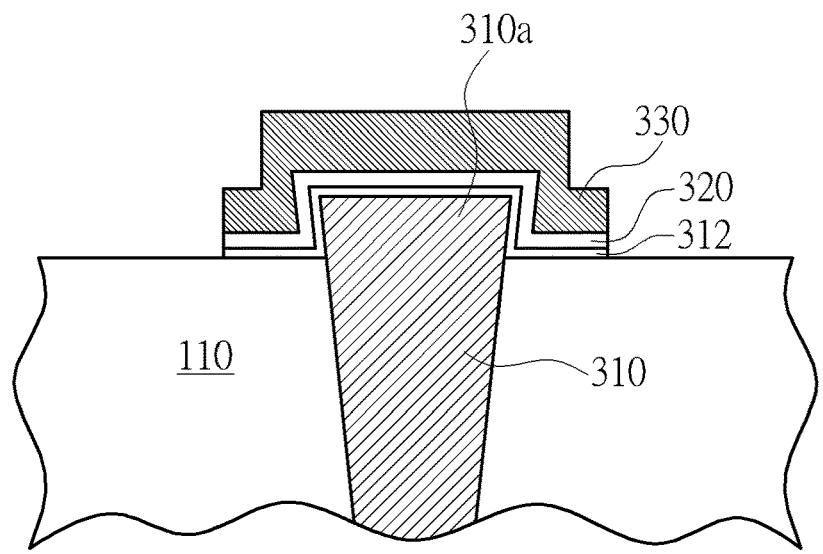
FIG. 2 is an enlarged view of the resistive random access memory according to another embodiment.

Please also refer to FIG. 2. FIG. 2 is an enlarged view of the resistive random access memory. According to another embodiment, a conductive layer 312 may be disposed between the protruding upper end portion 310a of the contact plug 310 and the resistive material layer 320. The conductive layer 312 may comprise titanium, titanium nitride, tantalum, tantalum nitride, or a combination thereof.

According to one embodiment, a top electrode 330 is disposed on the resistive material layer 320. According to one embodiment, the top electrode 330 may comprise titanium, titanium nitride, tantalum, tantalum nitride, or a combination thereof.

According to one embodiment, a second inter-layer dielectric (ILD) layer 120 covers the top electrode 330 and the first ILD layer 110. An interconnect structure 520 is disposed in the second ILD layer 120. The interconnect structure 520 is in direct contact with the top electrode 330. According to one embodiment, the interconnect structure 520 may be a damascened copper interconnect fabricated in the $M_1$ layer.

According to one embodiment, the transistor 10 further comprise a source/drain region 103 in the substrate 100, which is opposite to the source/drain region 102. A contact plug 313 is disposed in the first ILD layer 110 to electrically couple to the source/drain region 103. Likewise, the contact plug 313 includes a protruding upper end portion 313a above the top surface 110a of the first ILD layer 110.

According to one embodiment, an interconnect structure 523 is disposed in the second ILD layer 120 to electrically couple to the protruding upper end portion 313a.

Please refer to FIG. 3 to FIG. 8. FIG. 3 to FIG. 8 are schematic, cross-sectional diagrams showing a method for fabricating a resistive random access memory (RRAM) cell in accordance with one embodiment of the invention, wherein like numeral numbers designate like layers, regions, or elements.

Figure 3:
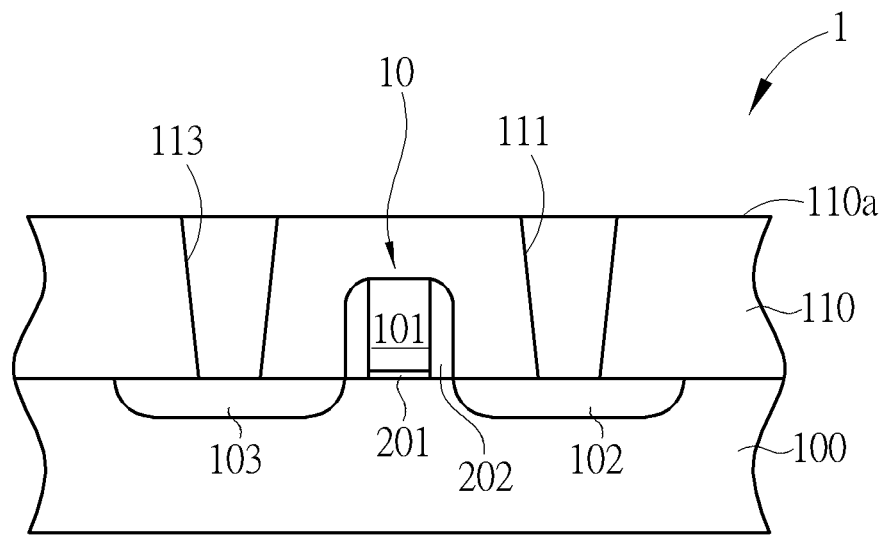
FIG. 3 to FIG. 8 are schematic, cross-sectional diagrams showing a method for fabricating a RRAM cell in accordance with one embodiment of the invention.

As shown in FIG. 3, first, a substrate 100 having thereon a transistor 10 is provided. According to one embodiment, the substrate 100 may be a silicon substrate, but is not limited thereto. The transistor 10 includes a gate 101 on the substrate 100 and source/drain regions 102 and 103 in the substrate 100. A gate dielectric layer 201 such as a silicon oxide layer may be disposed between the gate 101 and the substrate 100. A spacer 202 may be disposed on each sidewall of the gate 101.

According to one embodiment, a first inter-layer dielectric (ILD) layer 110 such as a silicon oxide layer is deposited on the substrate 100 to cover the transistor 10. The ILD layer 110 covers the gate 101 and the source/drain region 102.

A contact hole 111 and a contact hole 113 are formed in the first ILD layer 110. The contact hole 111 is formed directly above the source/drain region 102 and the contact hole 113 is formed directly above the source/drain region 103.

Figure 4:
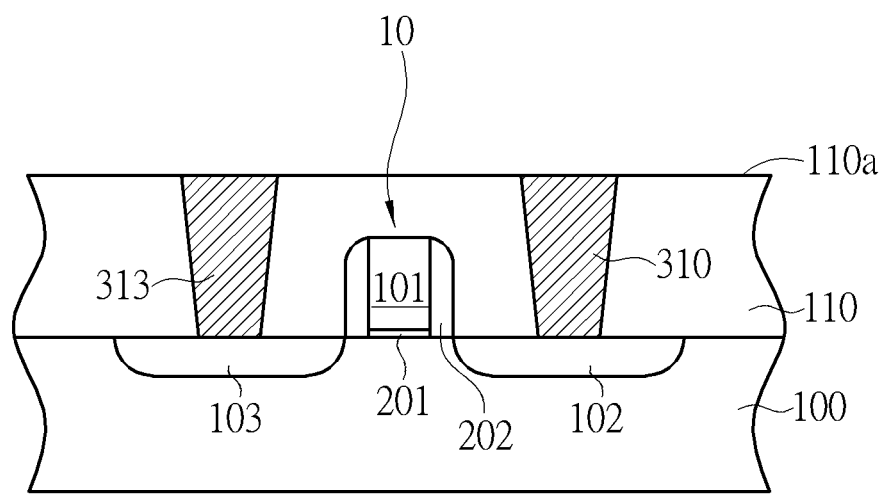

As shown in FIG. 4, a contact plug 310 is formed in the contact hole 111 in the first ILD layer 110 and the contact plug 310 lands on the source/drain region 102. A contact plug 313 is formed in the contact hole 113 in the first ILD layer 110 and the contact plug 313 lands on the source/drain region 103. At this point, the top surfaces of the contact plugs 310 and 313 are flush with the top surface 110a of the first ILD layer 110.

Figure 5:
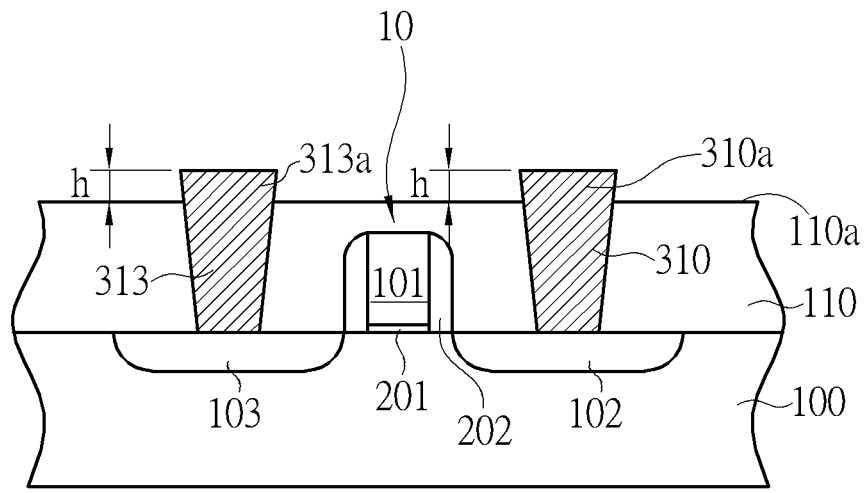

As shown in FIG. 5, the top surface 110a of the first ILD layer 110 may be subjected to an oxide buff treatment during a contact W CMP (tungsten chemical mechanical polishing) process to recess the top surface 110a of the first ILD layer 110, such that an upper end portion 310a of the contact plug 310 protrudes from a recessed top surface 110a of the first ILD layer 110, and an upper end portion 313a of the contact plug 313 protrudes from a recessed top surface 110a of the first ILD layer 110.

Figure 6:
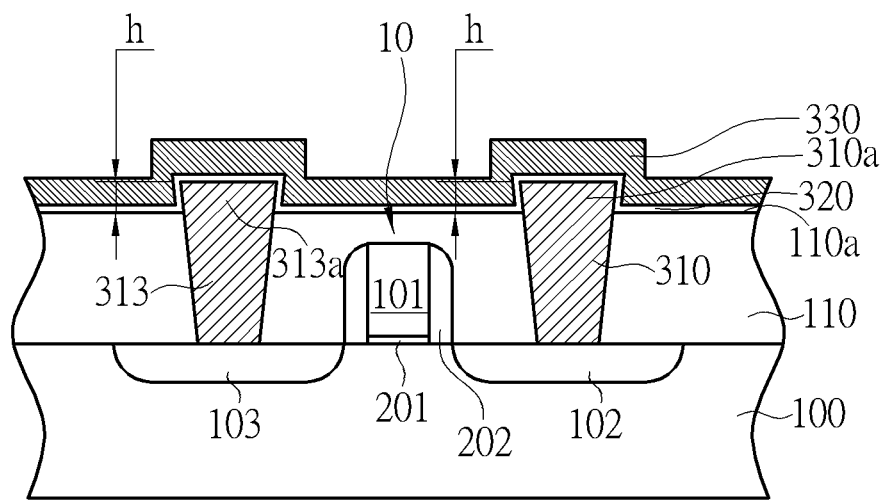

As shown in FIG. 6, a resistive material layer 320 is conformally deposited on the protruding upper end portions 310a, 313a of the contact plugs 310, 313 and on the top surface 110a of the first ILD layer 110. A top electrode 330 is conformally deposited on the resistive material layer 320.

Figure 7:
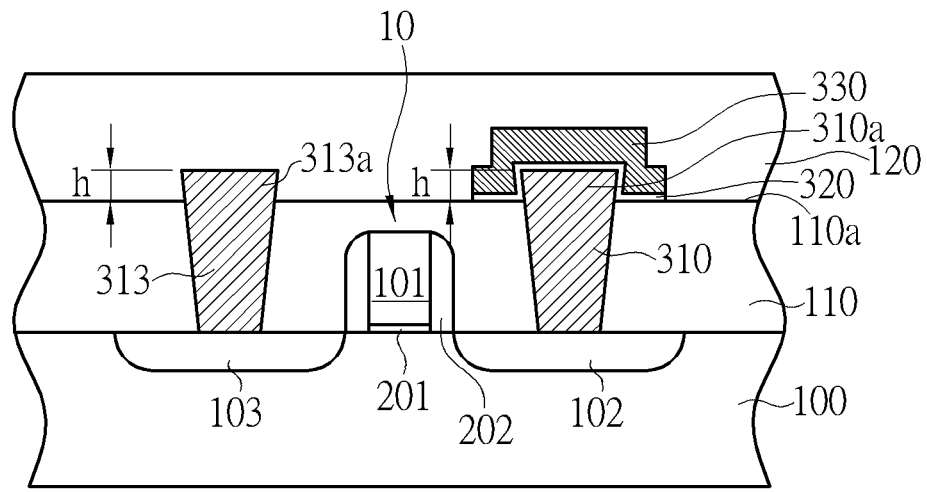

As shown in FIG. 7, a lithographic process and a dry etching process may be performed to pattern the resistive material layer 320 and the top electrode 330 on the protruding upper end portion 310a of the contact plug 310.

Figure 8:
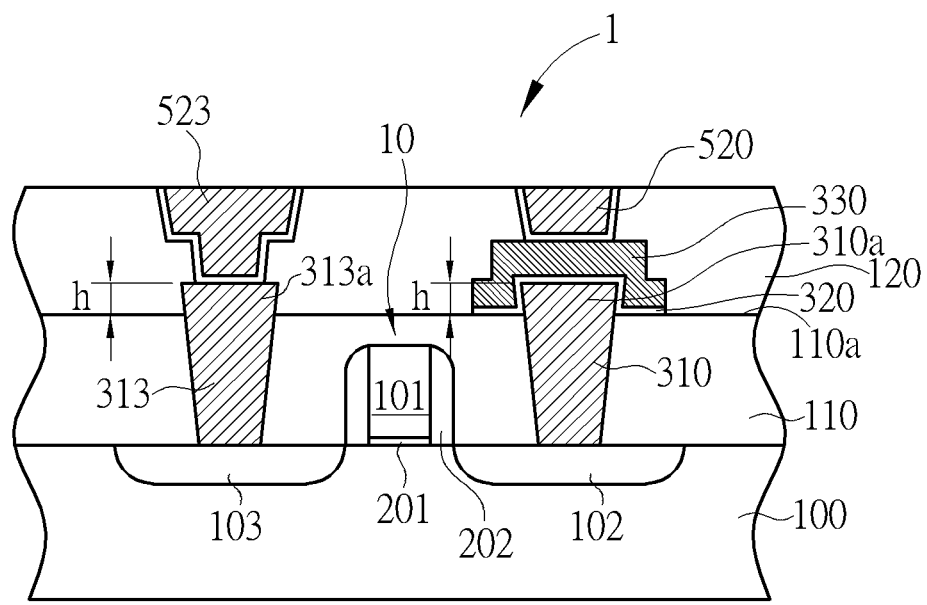

As shown in FIG. 8, a second ILD layer 120 is deposited on the first ILD layer 110. An interconnect structure 520 is formed in the second ILD layer 120. The interconnect structure 520 is in direct contact with the top electrode 330. According to one embodiment, the interconnect structure 520 may be a damascened copper interconnect fabricated in the $M_1$ layer. an interconnect structure 523 is formed in the second ILD layer 120 to electrically couple to the protruding upper end portion 313a.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A resistive random access memory (RRAM) cell, comprising:
   a substrate;
   a transistor having a gate on the substrate and a source/drain region in the substrate;
   a first inter-layer dielectric layer covering the transistor;
   a contact plug disposed in the first inter-layer dielectric layer and landing on the source/drain region, wherein an upper end portion of the contact plug protrudes from a top surface of the first inter-layer dielectric layer;
   a resistive material layer conformally covering the protruding upper end portion of the contact plug and the top surface of the first inter-layer dielectric layer; and
   a top electrode conformally covering the resistive material layer.

2. The RRAM cell according to claim 1 further comprising a conductive layer between the protruding upper end portion of the contact plug and the resistive material layer.

3. The RRAM cell according to claim 2, wherein the conductive layer comprises titanium, titanium nitride, tantalum, tantalum nitride, or a combination thereof.

4. The RRAM cell according to claim 1, wherein the resistive material layer is in direct contact with the protruding upper end portion of the contact plug, and wherein the contact plug acts as a bottom electrode.

5. The RRAM cell according to claim 1, wherein a height of the protruding upper end portion of the contact plug above the top surface of the first inter-layer dielectric layer ranges between 0 and 200 angstroms.

6. The RRAM cell according to claim 1, wherein a height of the protruding upper end portion of the contact plug above the top surface of the first inter-layer dielectric layer is about 100 angstroms.

7. The RRAM cell according to claim 1 further comprising a second inter-layer dielectric layer covering the top electrode and the first inter-layer dielectric layer.

8. The RRAM cell according to claim 7 further comprising an interconnect structure in the second inter-layer dielectric layer, wherein the interconnect structure is in direct contact with the top electrode.

9. The RRAM cell according to claim 1, wherein the resistive material layer comprises hafnium oxide, zirconium oxide, aluminum oxide, nickel oxide, tantalum oxide or titanium oxide.

10. The RRAM cell according to claim 1, wherein the contact plug comprises tungsten, wherein the top electrode comprises titanium, titanium nitride, tantalum, tantalum nitride, or a combination thereof.

11. A method for fabricating a resistive random access memory (RRAM) cell, comprising:
providing a substrate;
forming a transistor having a gate on the substrate and a source/drain region in the substrate;
depositing a first inter-layer dielectric layer covering the transistor;
forming a contact plug in the first inter-layer dielectric layer and landing on the source/drain region, wherein an upper end portion of the contact plug protrudes from a top surface of the first inter-layer dielectric layer;
forming a resistive material layer on the protruding upper end portion of the contact plug and the top surface of the first inter-layer dielectric layer; and
forming a top electrode conformally covering the resistive material layer.

12. The method according to claim 11 further comprising:
forming a conductive layer between the protruding upper end portion of the contact plug and the resistive material layer.

13. The method according to claim 12, wherein the conductive layer comprises titanium, titanium nitride, tantalum, tantalum nitride, or a combination thereof.

14. The method according to claim 11, wherein the resistive material layer is in direct contact with the protruding upper end portion of the contact plug, and wherein the contact plug acts as a bottom electrode.

15. The method according to claim 11, wherein a height of the protruding upper end portion of the contact plug above the top surface of the first inter-layer dielectric layer ranges between 0 and 200 angstroms.

16. The method according to claim 11, wherein a height of the protruding upper end portion of the contact plug above the top surface of the first inter-layer dielectric layer is about 100 angstroms.

17. The method according to claim 1 further comprising:
forming a second inter-layer dielectric layer on the top electrode and the first inter-layer dielectric layer.

18. The method according to claim 17 further comprising:
forming an interconnect structure in the second inter-layer dielectric layer, wherein the interconnect structure is in direct contact with the top electrode.

19. The method according to claim 11, wherein the resistive material layer comprises hafnium oxide, zirconium oxide, aluminum oxide, nickel oxide, tantalum oxide or titanium oxide.

20. The method according to claim 11, wherein the contact plug comprises tungsten, wherein the top electrode comprises titanium, titanium nitride, tantalum, tantalum nitride, or a combination thereof.

* * * * *